(12) United States Patent
Camuffo et al.

(10) Patent No.: US 9,190,959 B2
(45) Date of Patent: Nov. 17, 2015

(54) CIRCUIT, TRANSCEIVER AND MOBILE COMMUNICATION DEVICE

(71) Applicant: Intel Mobile Communications GmbH, Neubiberg (DE)

(72) Inventors: Andrea Camuffo, Munich (DE); Alexander Belitzer, Munich (DE); Bernhard Sogl, Unterhaching (DE)

(73) Assignee: Intel Deutschland GmbH, Neubiberg (DE)

( * ) Notice: Subject to any disclaimer, the term of this patent is extended or adjusted under 35 U.S.C. 154(b) by 146 days.

(21) Appl. No.: 13/674,599

(22) Filed: Nov. 12, 2012

(65) Prior Publication Data

US 2014/0133526 A1 May 15, 2014

(51) Int. Cl.
*H03F 1/02* (2006.01)

(52) U.S. Cl.
CPC ............ *H03F 1/0233* (2013.01); *H03F 1/0222* (2013.01)

(58) Field of Classification Search
USPC .................. 375/219, 254, 296, 297
See application file for complete search history.

(56) References Cited

U.S. PATENT DOCUMENTS

| | | | | |
|---|---|---|---|---|
| 5,420,536 | A | * 5/1995 | Faulkner et al. | 330/149 |
| 2012/0106676 | A1 | * 5/2012 | McCallister et al. | 375/297 |
| 2013/0257529 | A1 | * 10/2013 | Komninakis et al. | 330/149 |

* cited by examiner

*Primary Examiner* — Kabir A Timory
(74) *Attorney, Agent, or Firm* — Eschweiler & Associates, LLC

(57) ABSTRACT

A circuit for providing a bias signal for a power amplifier includes a first input, a second input and an output. The first input is configured to receive an input signal to be amplified by the power amplifier. The second input is configured to receive the amplified input signal. The output is configured to provide the bias signal.

8 Claims, 9 Drawing Sheets

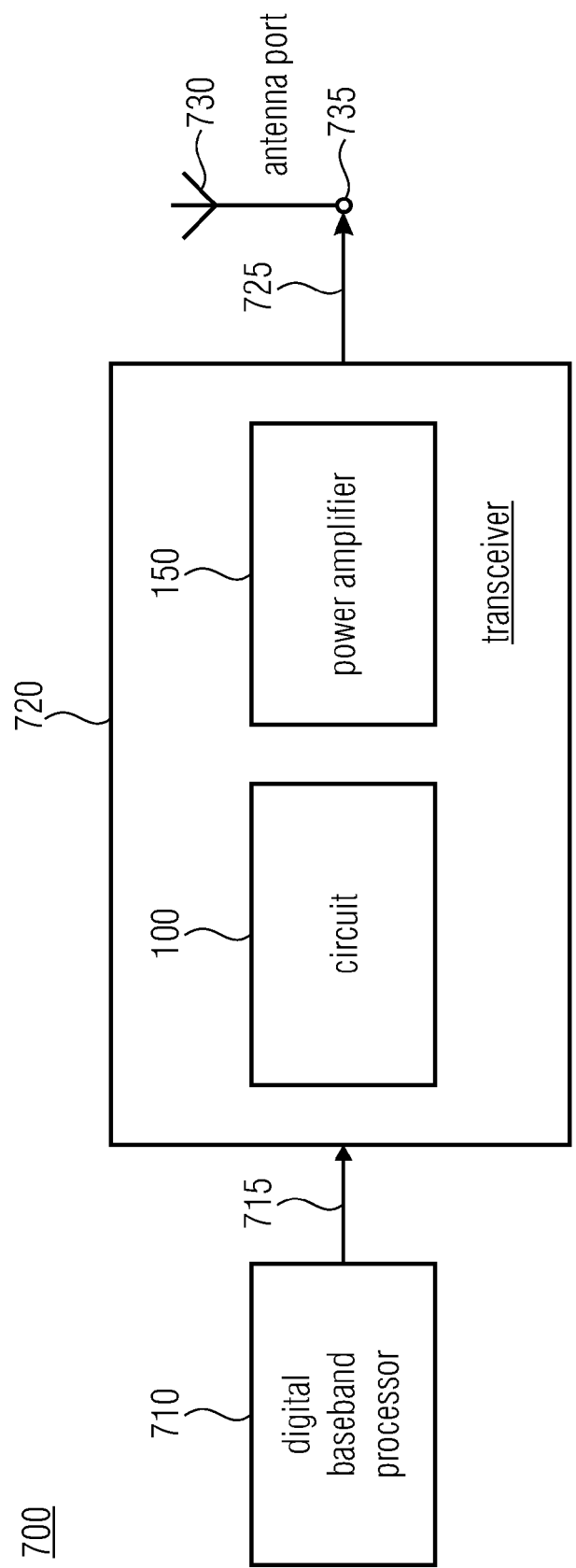

440

442  444

| offset 1 | slope 1 |
| offset 2 | slope 2 |
|  |  |
|  |  |
|  |  |
| offset N | slope N |

441  443

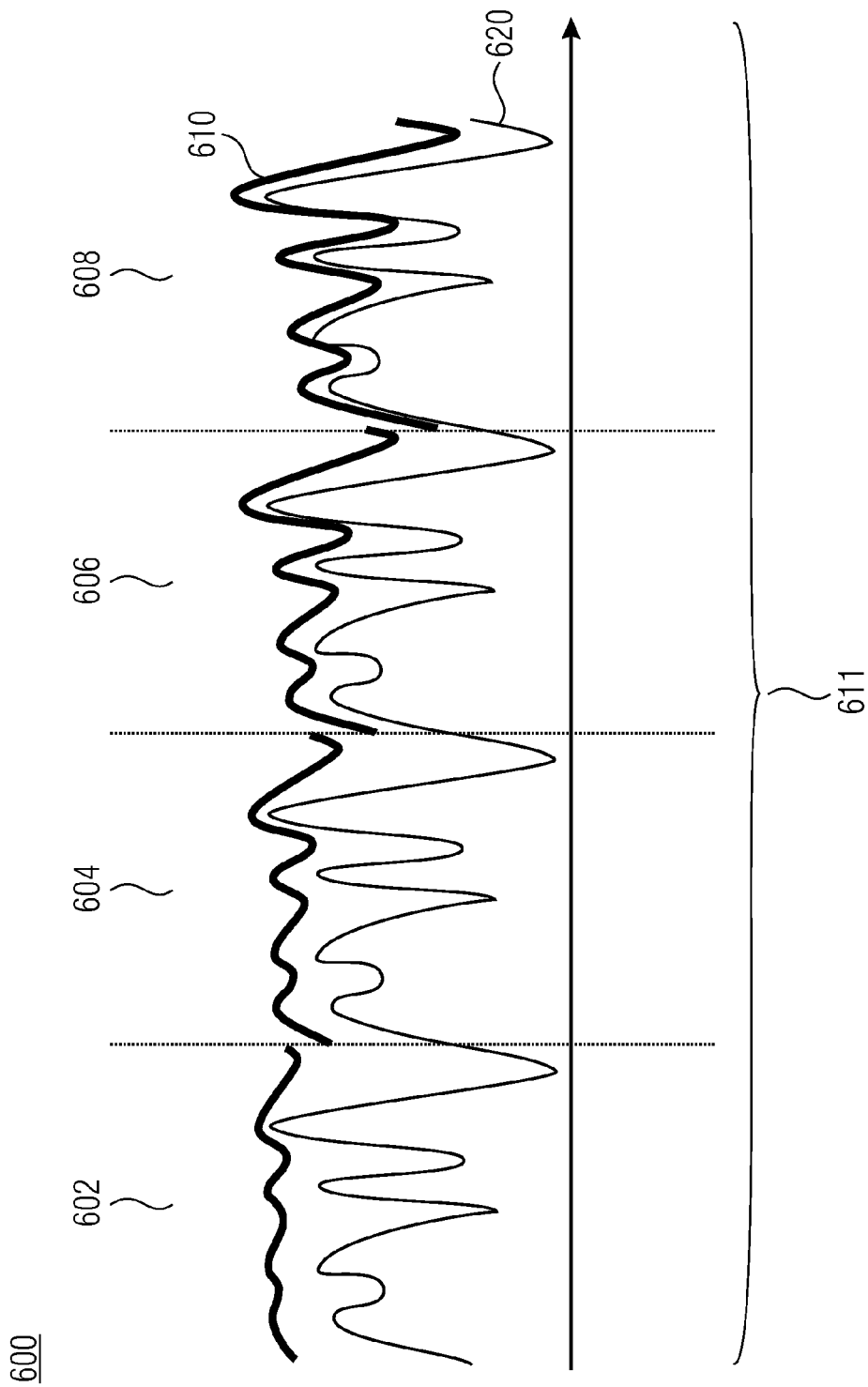

CIRCUIT, TRANSCEIVER AND MOBILE COMMUNICATION DEVICE

FIELD

The present invention relates to a circuit, a transceiver and a mobile communication device. In particular, the present invention relates to a circuit for providing a bias signal for a power amplifier.

BACKGROUND

Recently, in order to save current in a transmit chain, the mobile phone manufacturers have been moving towards "envelope tracking", which is a technique where the power amplifier is supplied through a fast DC/DC converter whose output voltage is varying over time as a function of the amplitude modulation. The concept of envelope tracking is to operate as close as possible to saturation during the modulation peaks and to lower the voltage when the instantaneous amplitude signal is low, thereby boosting the power amplifier efficiency.

However, there are significant challenges in this concept. In fact, the gain of the power amplifier is affected by the DC/DC voltage. Thus, if one simply tries to follow the peaks of the signal with the DC/DC converter, the gain variation will result in a distortion of the modulation.

Furthermore, AM/PM phenomena may take place, which will also impair the modulation quality, therefore resulting in spurious emissions (unwanted energy in neighboring channels) or an error vector magnitude (EVM) degradation.

In conventional systems there are two ways to minimize the unwanted phenomena highlighted above. One conventional approach is to choose the trajectory of the DC/DC control voltage accurately so that the power amplifier gain stays constant. It has to be noted, however, that as the signal level increases and the power amplifier approaches saturation, its instantaneous gain diminishes. In particular, the intention of envelope tracking is to increase the DC/DC voltage when the amplitude signal goes through a peak. Here, increasing the DC/DC voltage generally leads to a gain increase. By combining these two effects, a cancellation can be obtained; hence limiting the unwanted distortion of the signal. For this concept, the AM/PM phenomena introduced by the power amplifier should be negligible.

Another conventional approach is to compensate both AM/AM and AM/PM distortions by adequately predistorting the input wave into the power amplifier. This can be accomplished with an analog real-time closed loop architecture or using some fixed predistortion. The predistortion based on closed loop architectures typically requires extremely wide bandwidth in order to not create excess noise at a duplexer offset. When using the predistortion without the closed loop architecture, it is typically required that the characteristic of the power amplifier is known with good detail.

The first conventional approach of the envelope tracking relies heavily on the knowledge of the so-called "isogain" contours, which have to be individually calibrated on each phone. However, also the second conventional approach of the predistortion requires the knowledge of the AM/AM and the AM/PM curves as a function of the instantaneous DC/DC voltage.

A disadvantage of the first conventional approach is that calibrating the isogain contours is a long task, which prolongs the calibration time in the factory. Also, the calibrated isogain contours typically have to be stored in a random-access memory (RAM) and they are characterized in that they are fixed. This results in the fact that if the power amplifier characteristic is not perfectly stable over different conditions (e.g. aging, temperature, load, etc.), the matching of the gain loss because of a proximity to saturation and the gain expansion because of an increased DC/DC voltage can no longer be achieved, therefore leading to a spectrum worsening.

A disadvantage of the second conventional approach is that the AM/AM and AM/PM predistortion also requires a significant individual calibration. Furthermore, its adequateness is typically not always guaranteed under all circumstances.

Therefore, conventional systems are disadvantageous in that they are rather inflexible and in that a time-consuming calibration task in the factory is required.

SUMMARY

The present invention relates to a circuit for providing a bias signal for a power amplifier. The circuit comprises a first input, a second input and an output for providing the bias signal. The first input is configured to receive an input signal to be amplified by the power amplifier. The second input is configured to receive the amplified input signal.

Furthermore, the present invention relates to a transceiver comprising a power amplifier, a bias modifier, a feedback receiver and an adjuster. The power amplifier is configured to provide an amplified input signal based on an RF input signal which is dependent on a digital baseband signal. The bias modifier is configured to vary a bias signal for the power amplifier based on the digital baseband signal. The feedback receiver is configured to determine an information describing the amplified input signal. The adjuster is configured to adjust a distortion compensation rule based on the information describing the amplified input signal, which is provided by the feedback receiver, to counteract or compensate a distortion of the amplified input signal.

Furthermore, the present invention relates to a mobile communication device comprising a digital baseband processor, a transceiver and an antenna port. The transceiver comprises a circuit and a power amplifier. The digital baseband processor is configured to provide a digital baseband signal. The circuit is configured to provide a bias signal for a power amplifier. The circuit comprises a first input, a second input and an output for providing the bias signal. The first input is configured to receive the digital baseband signal as an input signal to be amplified by the power amplifier. The second input is configured to receive the amplified input signal. The power amplifier is configured to provide the amplified input signal based on an RF input signal which is dependent on the digital baseband signal. The transceiver is coupled between the antenna port and the digital baseband processor.

BRIEF DESCRIPTION OF THE DRAWINGS

The present invention will be subsequently described taking reference with the enclosed figures in which:

FIG. 1A shows a block diagram of an example mobile communication device;

FIG. 6 shows a schematic diagram of an example process of an envelope tracking which is characterized by an increasing envelope tracking depth.

DETAILED DESCRIPTION

Figure 1B:
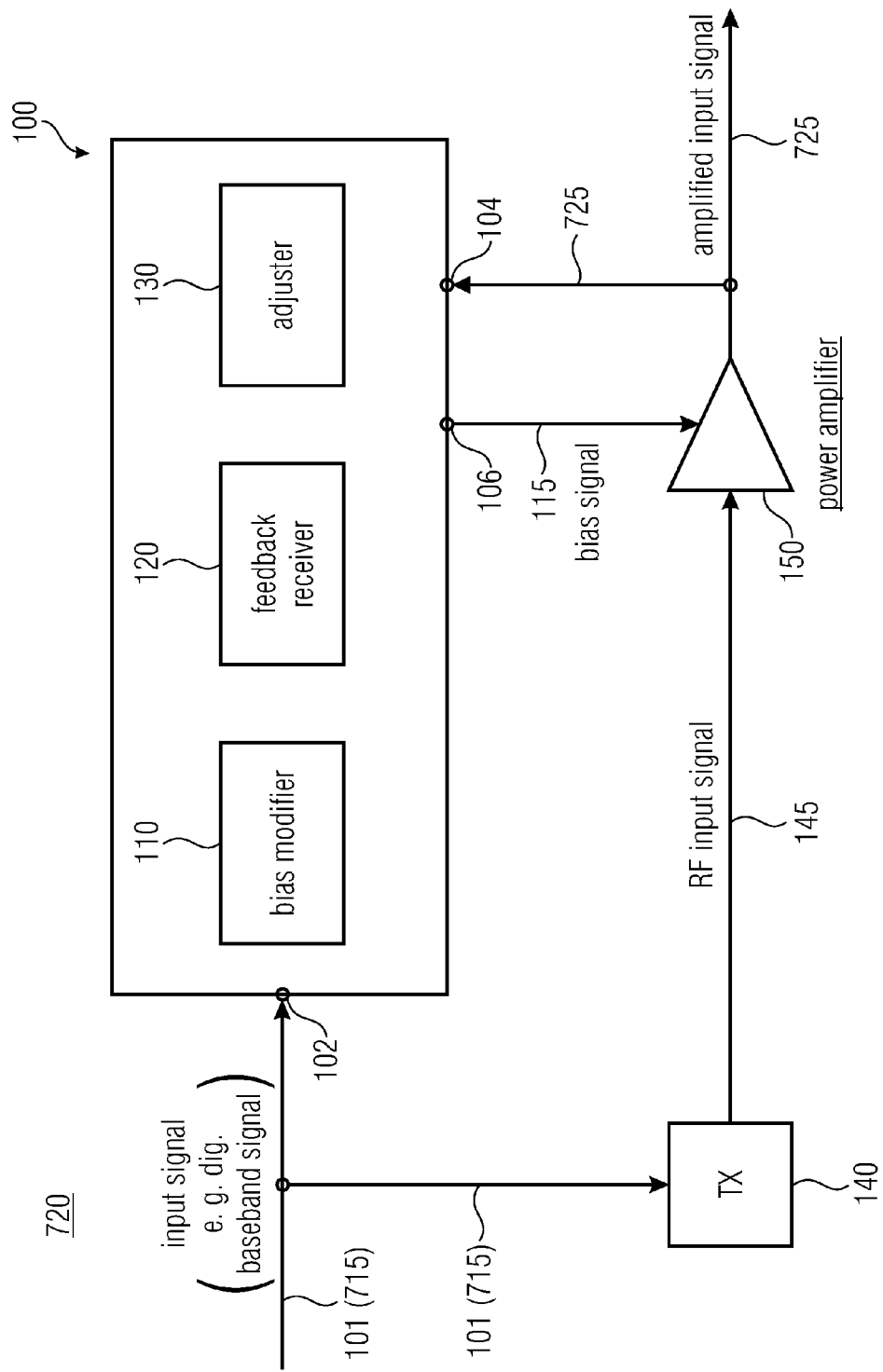
FIG. 1B shows a block diagram of an example circuit comprising a first input, a second input and an output for providing a bias signal for a power amplifier.

Before discussing the present invention in further detail using the drawings, it is pointed out that in the figures identical elements or elements having the same function or the same effect are provided with the same reference numerals so that the description of these elements and the functionality thereof illustrated in the different embodiments is mutually exchangeable or may be applied to one another in the different embodiments.

FIG. 1A shows a block diagram of an example mobile communication device 700. As shown in FIG. 1A, the mobile communication device 700 comprises a digital baseband processor 710, a transceiver 720 and an antenna port 735. The transceiver 720 is coupled between the antenna port 735 and the digital baseband processor 710.

For example, the digital baseband processor 710 is configured to provide a digital baseband signal 715. In addition, the transceiver 720 may be configured to receive the digital baseband signal 715 as an input signal and to output an amplified input signal 725. For example, the antenna port 735 may be coupled to an antenna 730. In addition, the antenna 730 may be configured to relay (or transmit) the amplified input signal 725 provided by the power amplifier 150 of the transceiver 720.

In addition, the transceiver 720 may comprise a circuit 100 and a power amplifier 150. The power amplifier 150 may be configured to provide the amplified input signal 725 based on an RF input signal which is dependent on the digital baseband signal 715.

Furthermore, the circuit 100 of the transceiver 720 shown in FIG. 1A may correspond to one of the circuits described herein.

The mobile communication device 700 may be a portable mobile communication device.

As an example, the mobile communication device 700 can be configured to perform a voice and/or data communication (according to a mobile communication standard) with another (portable) communication device and or a mobile communication base station. Such a mobile communication device may be, for example, a mobile handset such as a mobile phone (cell phone), a smart phone, a tablet PC, a broadband modem, a notebook or a laptop, as well as a router, a switch, a repeater or a PC. Furthermore, such a mobile communication device may be a mobile communication base station.

The circuit 100 allows for an improved flexibility of the mobile communication device 700. For example, the circuit 100 can be used to counteract or compensate a distortion of the amplified input signal 725 in the mobile communication device 700.

Even though in FIG. 1A the circuit 100 is presented as part of the mobile communication device 700, the circuit 100 may also be used in other circuits or devices. In the following, different examples of such a circuit will be described in more detail.

The conventional systems have the disadvantage that they are rather inflexible and that they require the time-consuming calibration task in the factory. Therefore, a need exists to provide an improved circuit avoiding this disadvantage.

Accordingly, it has been found that the just mentioned disadvantage can be avoided if a first input configured to receive an input signal to be amplified by the power amplifier, a second input configured to receive the amplified input signal and an output configured to provide a bias signal for the power amplifier are provided. Especially by providing the second input that receives the amplified input signal, it is possible to include an internal feedback receiver in the circuit or mobile communication device. Such an internal feedback receiver can be used instead of an external measurement device. By the use of the internal feedback receiver, it is possible to determine an information describing the amplified input signal on the basis of which a distortion compensation rule can be adjusted. This essentially provides an increased flexibility and avoids the time-consuming calibration task in the factory.

FIG. 1B shows a block diagram of an example circuit 100 comprising a first input 102, a second input 104 and an output 106 configured to provide a bias signal 115 for a power amplifier 150. As shown in FIG. 1B, the circuit 100 is configured to provide a bias signal 115 for a power amplifier 150. The first input 102 of the circuit 100 is configured to receive an input signal 101 (e.g. the digital baseband signal 715) to be amplified by the power amplifier 150. The second input 104 of the circuit 100 is configured to receive the amplified input signal 725. The output 106 of the circuit 100 is configured to provide the bias signal 115.

Furthermore, the circuit 100 may comprise the following additional features.

Referring to FIG. 1B, the circuit 100 may comprise a bias modifier 110, a feedback receiver 120 and an adjuster 130. For example, the bias modifier 110 is configured to vary the bias signal 115 for the power amplifier 150 based on the input signal 101. In addition, the feedback receiver 120 may be configured to determine an information describing the amplified input signal 725. Furthermore, the adjuster 130 may be configured to adjust a distortion compensation rule based on the information describing the amplified input signal 725, which is provided by the feedback receiver 120, to counteract or compensate a distortion of the amplified input signal 725. By counteracting or compensating the distortion of the amplified input signal 725, it is possible to avoid a degradation of the quality of the amplified input signal 725 at the output of the transceiver 720 of the mobile communication device 700 shown in FIG. 1A. Therefore, the quality of the amplified input signal 725 provided by the transceiver 720 or the mobile communication device 700 can essentially be maintained.

Further referring to FIG. 1B, the transceiver 720 including the circuit 100 may comprise a transmit (TX) signal generator 140 configured to provide, based on the input signal 101 or the digital baseband signal 715, a (digital baseband) TX signal as an RF input signal 145 for the power amplifier 150. In addition, the power amplifier 150 may be configured to provide the amplified input signal 725 based on the RF input signal 145 which is based on the input signal 101 or the digital baseband signal 715.

For example, the adjuster 130 of the circuit 100 is configured to adjust the distortion compensation rule to counteract or compensate a distortion of the amplified input signal 725 induced by the bias signal variation.

Furthermore, the bias modifier 110 of the circuit 100 may be configured to perform an envelope tracking (ET) modulation. In addition, the feedback receiver 120 and the adjuster 130 may be configured to perform an amplitude modulation (AM). For example, the adjuster 130 is configured to adjust the distortion compensation rule to counteract or compensate a distortion of the amplified input signal 725 induced by a time misalignment between the amplitude modulation (AM) and the envelope tracking (ET) modulation. Here, it is pointed out that by counteracting or compensating the distortion of the amplified input signal 725 which is induced by the time misalignment between the amplitude modulation (AM) and the envelope tracking (ET) modulation, it is possible to provide a system (i.e. circuit 100, transceiver 720 or mobile communication device 700) that is able to avoid such time alignment problems.

Figure 2:
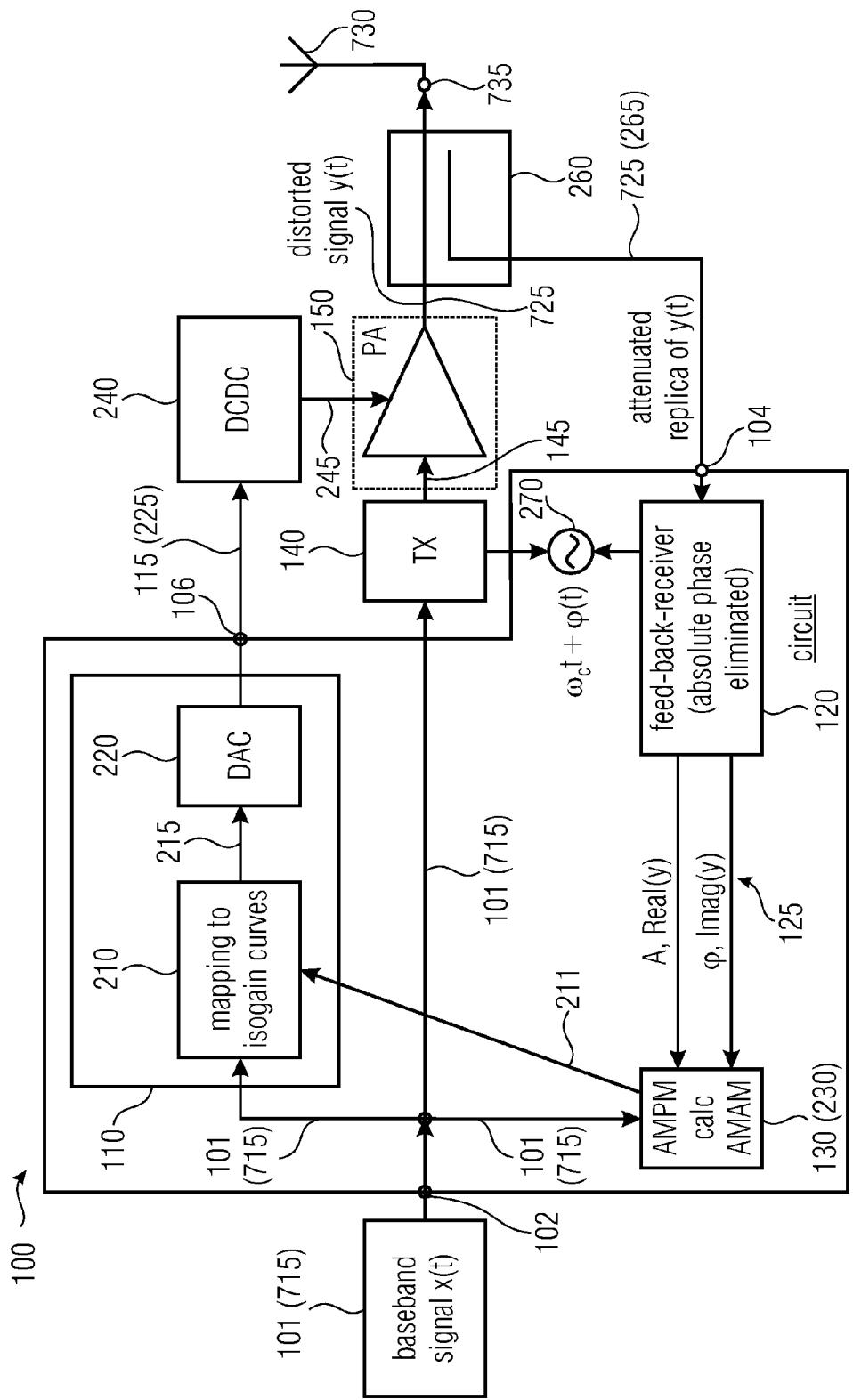
FIG. 2 shows a block diagram of an example implementation of the circuit shown in FIG. 1B comprising a bias modifier, a feedback receiver and an adjuster for adjusting a bias modification rule.

FIG. 2 shows a block diagram of an example implementation of the circuit 100 shown in FIG. 1B comprising a bias modifier 110, a feedback receiver 120 and an adjuster 130 for adjusting a bias modification rule. In FIG. 2, the first input 102 of the circuit 100 which is configured to receive the input signal 101 (or the digital baseband signal 715) to be amplified by the power amplifier 150 is shown. Here, the input signal 101 or the digital baseband signal 715 is exemplarily denoted by "baseband signal x(t)". In addition, the second input 104 of the circuit 100 which is configured to receive the amplified input signal 725 is shown in FIG. 2. Furthermore, FIG. 2 shows the output 106 of the circuit 100 which is configured to provide the bias signal 115. The elements 140, 150, 735 and 730 shown in FIG. 2 substantially correspond to the elements described with reference to the circuit 100 shown in FIG. 1B and the mobile communication device 700 shown in FIG. 1A.

Referring to FIG. 2, the adjuster 130 of the circuit 100 is configured to adjust a bias modification rule. The adjustment of the bias modification rule performed with the adjuster 130 is exemplarily indicated by an arrow 211 pointing from the adjuster 130 to the bias modifier 110 in FIG. 2. In addition, the bias modifier 110 of the circuit 100 may be configured to apply the bias modification rule to obtain the bias signal 115 for the power amplifier 150.

For example, the first input 102 of the circuit 100 is configured to receive a digital baseband signal 715 as the input signal 101. In addition, the bias modifier 110 of the circuit 100 may comprise a mapper 210 and a digital-to-analog converter 220 (DAC). For example, the mapper 210 is configured to map the amplitude of the digital baseband signal 715 to a digital voltage signal 215. Furthermore, the digital-to-analog converter 220 (DAC) may be configured to convert the mapped digital voltage signal 215 into the bias signal 115 for the power amplifier 150. The bias signal 115 (which is output by the circuit 100 shown in the example implementation of FIG. 2) is, for example, an analog voltage signal 225 to be used by a DC/DC converter 240.

Referring to FIG. 2, the DC/DC converter 240 may be configured to adjust a supply voltage 245 of the power amplifier 150 based on the bias signal 115 (e.g. the analog voltage signal 225 provided by the DAC 220).

Further referring to FIG. 2, the mapper 210 may be configured to perform the mapping between the amplitude (or power) of the input signal 101 or the digital baseband signal 715 and the digital voltage signal 215 based on the isogain curves. Accordingly, the mapper 210 shown in FIG. 2 is exemplarily denoted by "mapping to isogain curves".

In the example implementation of FIG. 2, the feedback receiver 120 of the circuit 100 may be configured to determine an amplitude information (A) and/or a phase information (ϕ) as the information 125 describing the amplified input signal 725.

For example, the feedback receiver 120 is configured to determine the information 125 describing the amplified input signal 725 using a measurement signal 265 provided by a detector 260. As exemplarily depicted in FIG. 2, the detector 260 is coupled to the output of the power amplifier 150 and may be configured to provide a measurement signal 265 for the feedback receiver 120. For example, the measurement signal 265 provided by the detector 260 substantially corresponds to the amplified input signal 725 provided by the power amplifier 150. In addition, the measurement signal 265 may be an attenuated replica of the amplified input signal 725. The amplified input signal 725 provided at the output of the power amplifier 150 may represent a distorted signal. In FIG. 2, the amplified input signal 725 or the distorted signal is exemplarily denoted by y(t).

Furthermore, the detector 260 may be part of the feedback receiver 120 which is included in the circuit 100.

As exemplarily depicted in FIG. 2, the amplitude information/phase information (A, ϕ) which constitutes the information 125 provided by the feed-back receiver 120 may correspond to a real and an imaginary part of the signal y ("Real(y)", "Imag(y)"), respectively. The determination of the information 125 performed with the feedback receiver 120 comprises, for example, an absolute phase elimination based on a comparison of the amplified input signal 725 output by the power amplifier 150 and the RF input signal 145 input to the power amplifier 150 which is performed with module 270. Accordingly, the feedback receiver 120 is exemplarily denoted by "Feed-Back-Receiver (absolute phase eliminated)".

According to FIG. 2, the adjuster 130 of the circuit 100 may comprise an AM-AM/AM-PM calculator 230 (block exemplarily denoted by "AMPM calc AMAM") that is configured to calculate correction values from the information 125 describing the amplified input signal 725. For example, the adjuster 130 is configured to adjust the distortion compensation rule (e.g. the bias modification rule) using the calculated correction values.

As already described before, the feedback receiver 120 may be configured to determine the amplitude information A and/or the phase information ϕ describing the amplified input signal 725. For example, the AM-AM/AM-PM calculator 230 is configured to compare the amplitude information A and/or the phase information ϕ describing the amplified input signal 725 and the amplitude information and/or the phase information describing a desired input signal 101, and calculate the correction values based on the amplitude information and/or the phase information comparison.

Figure 3:
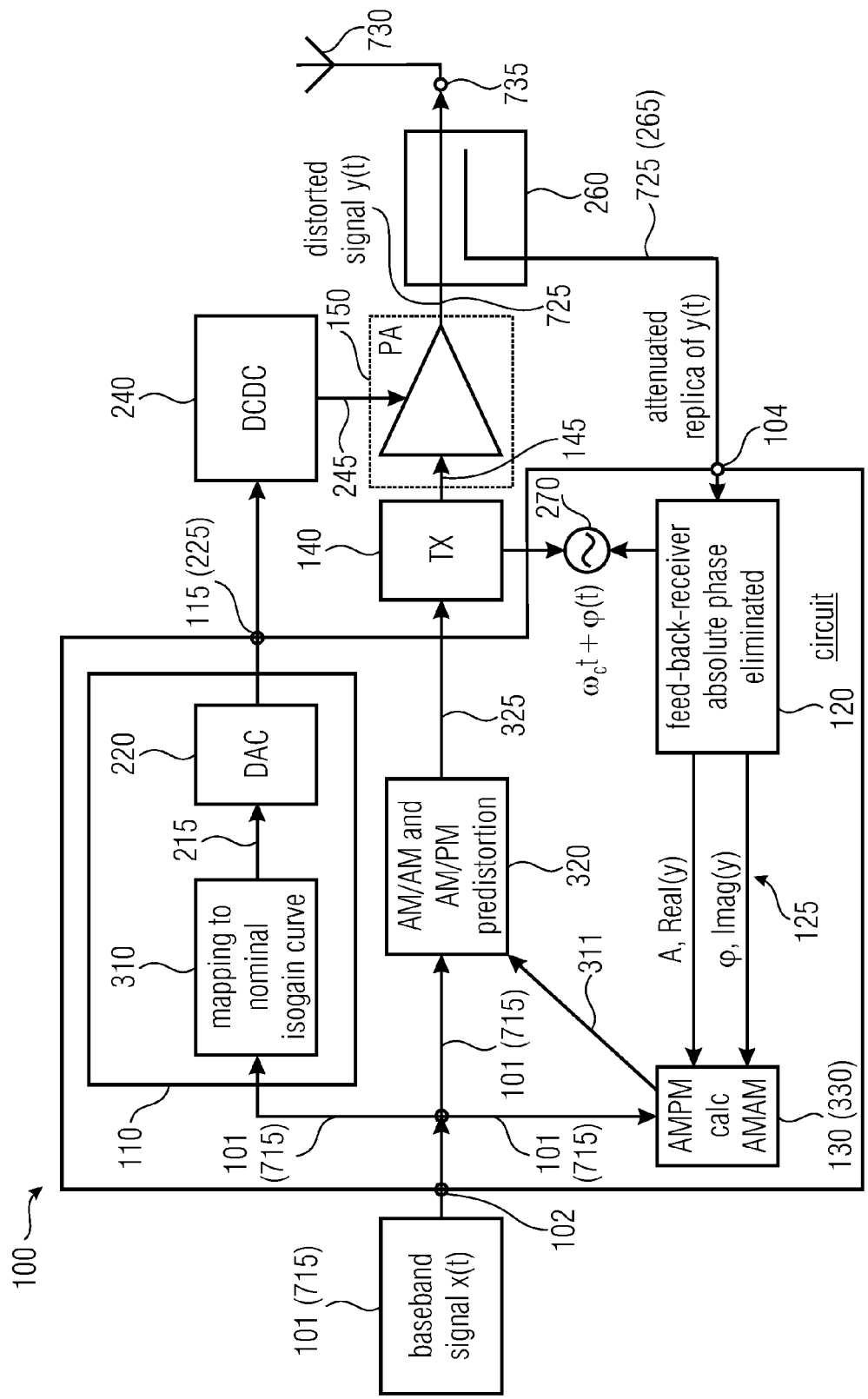
FIG. 3 shows a block diagram of an example implementation of the circuit shown in FIG. 1B comprising a bias modifier, a feedback receiver and an adjuster for adjusting a predistortion rule.

FIG. 3 shows a block diagram of an example implementation of the circuit 100 shown in FIG. 1B comprising a bias modifier 110, a feedback receiver 120 and an adjuster 130 configured to adjust a predistortion rule. The circuit 100 (including the elements 110, 120, 130) and the additional elements 140, 150, 240, 260, 735 and 730 shown in FIG. 3 substantially correspond to the circuit and the additional elements shown in FIG. 2. However, the circuit 100 shown in FIG. 3 further comprises a predistorter 320. The predistorter 320 of the circuit 100 may be configured to perform a predistortion of the input signal 101 (or the digital baseband signal 715) to obtain a predistorted signal 325 for the power amplifier 150. In the example implementation of FIG. 3, the adjuster 130 of the circuit 100 is configured to adjust a predistortion rule. For example, the predistorter 320 is configured to apply the predistortion rule to obtain the predistorted signal 325 for the power amplifier 150.

In FIG. 3, the adjustment of the predistortion rule performed with the adjuster 130 is exemplarily indicated by an arrow 311 pointing from the adjuster 130 to the predistorter 320. The adjuster 130 of the circuit 100 shown in FIG. 3 may comprise an AM-AM/AM-PM calculator 330 configured to calculate correction values from the information 125 describing the amplified input signal 725. For example, the adjuster 130 is configured to adjust the predistortion rule (arrow 311) using the calculated correction values obtained from the AM-AM/AM-PM calculator 330. In FIG. 3, the predistorter 320 (block exemplarily denoted by "AM/AM and AM/PM predistortion") is, for example, configured to apply an AM/AM and AM/PM predistortion to the input signal 101 or the digital baseband signal 715.

As opposed to the example implementation of FIG. 2, the bias modifier 110 of the circuit 100 shown in FIG. 3 comprises a mapper 310 exemplarily denoted by "mapping to nominal isogain curve". This indicates that the mapping between the amplitude (or power) of the input signal 101 or the digital baseband signal 715 and the digital voltage signal 215 performed with the mapper 310 is characterized to be predetermined or fixed and is substantially based on a nominal (i.e. predetermined or fixed) isogain curve. In the example implementation of FIG. 3, the adjuster 130 is configured to adjust the predistortion rule (arrow 311) and not the bias modification rule (arrow 211) as in the example implementation of FIG. 2.

In the case of the predistortion according to FIG. 3, the DC/DC voltage substantially follows a trajectory which is a nominal isogain curve, and the linearity of the whole system can be maintained through the predistortion. It is also pointed out here that through this approach, it is also possible to correct AM/PM effects, thereby realizing a more powerful system.

Figure 4A:
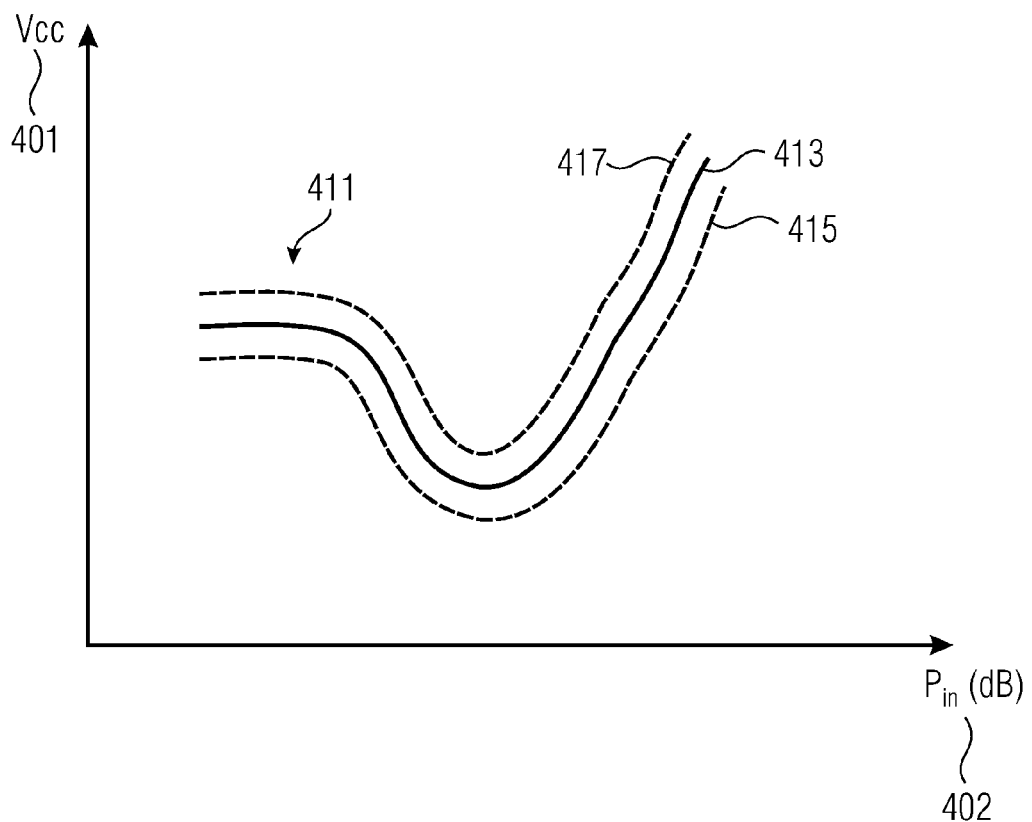
FIG. 4A shows a schematic diagram of example isogain curves.

FIG. 4A shows a schematic diagram 410 of example isogain curves 411. In the schematic diagram 410 of FIG. 4A, the ordinate corresponds to a supply voltage 401, Vcc, while the abscissa corresponds to an input power in dB 402, $P_{in}$ (dB). The example isogain curves 411 shown in FIG. 4A can essentially be used to adjust the power amplifier 150 shown in FIGS. 1A, 1B, 2 and 3 such that a constant gain of the power amplifier 150 will be obtained. In particular, each of the example isogain curves 411 in FIG. 4A relates the input power 402, $P_{in}$, to the supply voltage 401, Vcc. For example, there are three different isogain curves 413, 415, 417 lying close to each other which correspond to different gains of the power amplifier 150.

Figure 4B:
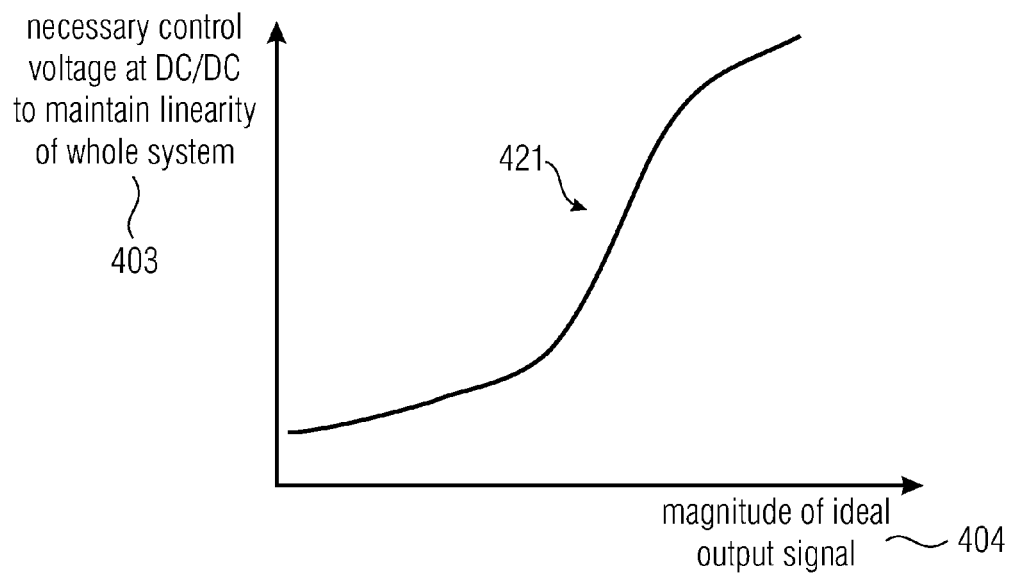
FIG. 4B shows a schematic diagram of a relationship between a magnitude of an ideal output signal and a necessary control voltage at a DC/DC converter to maintain a system linearity.

FIG. 4B shows a schematic diagram 420 of an example relationship 421 between a magnitude 404 of an ideal output signal and a necessary control voltage 403 at a DC/DC converter to maintain a system linearity. In the schematic diagram 420 of FIG. 4B, the ordinate corresponds to the necessary control voltage 403 at a DC/DC converter to maintain the linearity of the whole system, while the abscissa corresponds to the magnitude 404 of the ideal output signal. The example relationship 421 shown in FIG. 4B may be used to define the mapping performed with the mapper 210 of the bias modifier 110 in the circuit 100 shown in FIG. 2. In particular, the example relationship 421 relates the magnitude 404 of the ideal output signal (e.g. the digital baseband signal 715) to the necessary control voltage 403 (e.g. the mapped digital voltage signal 215) to be used by a DC/DC converter (such as the DC/DC converter 240).

Figure 4C:
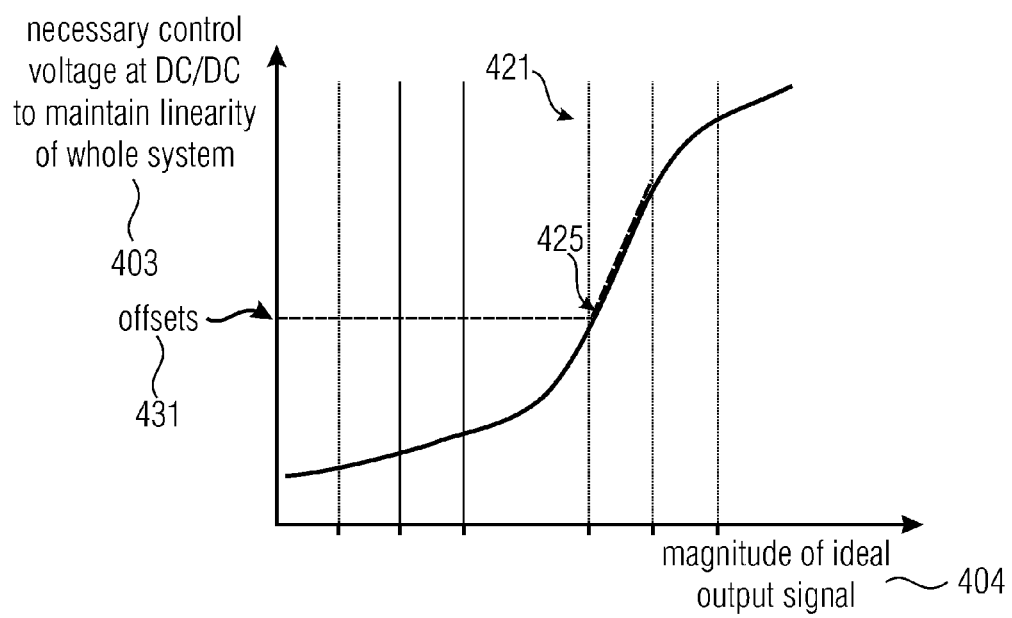
FIG. 4C shows a schematic diagram of an example sampling of the relationship shown in FIG. 4B.

FIG. 4C shows a schematic diagram 430 of an example sampling 425 of the relationship 421 shown in FIG. 4B. In the schematic diagram 430 of FIG. 4C, the ordinate corresponds to the necessary control voltage 403 at a DC/DC converter to maintain the linearity of the whole system, while the abscissa corresponds to the magnitude 404 of the ideal output signal. In particular, FIG. 4C shows the example sampling 425 which can be defined by offsets 431 and corresponding slopes. The sampling 425 substantially corresponds to a discrete representation of the continuous relationship 421, wherein the sampling 425 comprises discrete values for the offsets 431 and the corresponding slopes. For example, the sampling 425 shown in FIG. 4C can be used in one embodiment by the mapper 210 shown in FIG. 2.

Figures 4D, 4E:
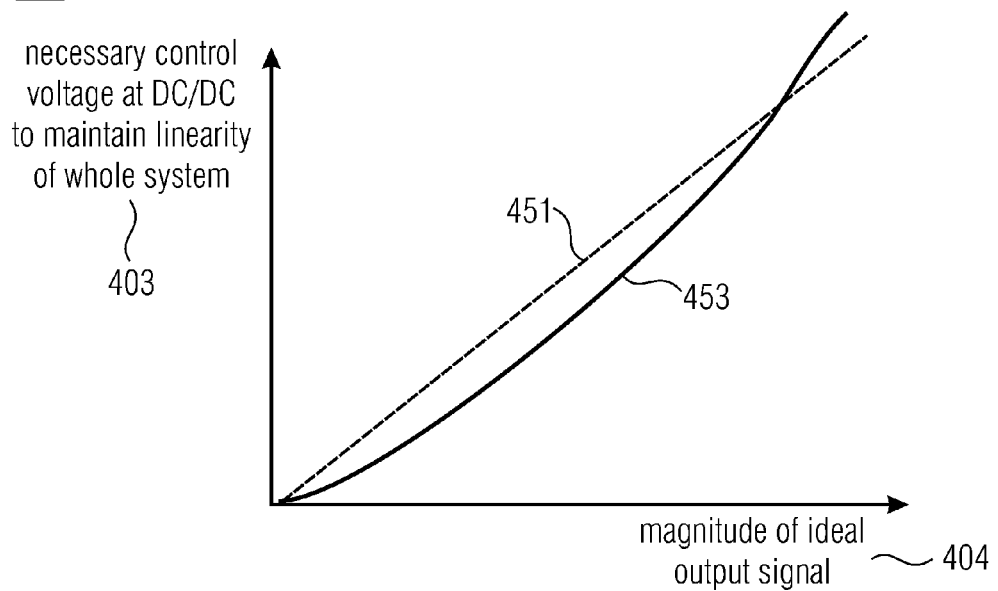
FIG. 4D shows an example table for storing offsets and slopes describing the relationship shown in FIG. 4B.
FIG. 4E schematically illustrates when to adapt the offsets and slopes shown in the table of FIG. 4D.

FIG. 4D shows an example table 440 for storing offsets 442 and slopes 444 describing the relationship 421 shown in FIG. 4B. In the table 440 of FIG. 4D, the first column 441 corresponds to the stored offsets 442 denoted by "offset 1", "offset ", . . . , "offset N", while the second column 443 corresponds to the stored slopes 444 denoted by "slope 1", slope 2", . . . , "slope N". For example, the table 440 shown in FIG. 4D represents a lookup table (LUT) which can be used to relate the magnitude 404 of the ideal output signal to the necessary control voltage 403 at the DC/DC converter using the stored offsets 442 and slopes 444. By the use of the table 440 shown in FIG. 4D, the mapping performed with the mapper 210 shown in FIG. 2 can be realized more efficiently.

Summarizing FIGS. 4A to 4D, it is noted that a typical isogain curve looks qualitatively like the one shown in FIG. 4A, which shows which combination of the supply voltage Vcc and the input power $P_{in}$ yields a constant output gain. There are several of these curves for different gains close to each other, like the dashed ones 415, 417 shown in FIG. 4A. In order to force the system to follow with one given isogain curve the amplitude of the output signal, it is therefore necessary to apply the predistortion to the output voltage before sending it to the DC/DC converter. The function can look like as in FIG. 4B. The curve 421 shown in FIG. 4B can be broken up in small pieces, and the single components (offsets and corresponding slopes) can then be stored into a table (e.g. table 440 of FIG. 4D). An efficient way to achieve this is, for example, to store start values and slopes for each region. Here, it is to be noted that if the sampling is tight enough, the error can be made negligible. The raster (or sampling), for example, can be fixed or programmable, wherein a fixed raster provides more simplicity. The values (offsets and slopes) can preferably be stored in a table such as shown in FIG. 4D. For example, if the raster is fixed, just the offsets can be saved, since the slopes can be calculated on the fly. However, this consumes computational power, and therefore it may be preferred to save the slopes as well. It is also possible to use a variable raster. In that case, it is also necessary to save the x-coordinate for each region.

FIG. 4E illustrates in a schematic diagram 450 when to adapt the offsets and slopes shown in the table of FIG. 4D. In the schematic diagram 450 of FIG. 4E, the ordinate corresponds to the necessary control voltage 403 at a DC/DC converter to maintain the linearity of the whole system, while the abscissa corresponds to the magnitude 404 of the ideal output signal. In particular, FIG. 4E shows an example AM/AM curve 451 and an example real isogain curve 453. These example curves 451, 453 shown in FIG. 4E can essentially be used by the adjuster 130 or the AM-AM/AM-PM calculator 230 shown in FIG. 2 to determine when to calculate the correction values for the adjustment of the distortion compensation rule.

Referring to FIGS. 2 and 4E, a (continuous) adaption of the isogain curves or isogain contours (which is performed for the adjustment of the distortion compensation rule) relies on the ability of the feedback receiver 120 in cooperation with the adjuster 130 or AM-AM/AM-PM calculator 230 to measure, for example, AM/AM curves and to compare, for example, the magnitude of the measured signal to the ideal one. In the ideal case, the AM/AM curve 451 is linear and crossing the origin. However, should the real isogain curve 453 deviate from the profile which is stored into the transceiver (or in the mapper 210 of the bias modifier 110 in the circuit 100), the circuit or transceiver can take action and update the table (e.g. table 440 shown in FIG. 4D), recalculating the offsets 442 and the slopes 444 using some algorithms. The recalculation of the offsets and slopes shall be more of an adaption (i.e. new values are close to old ones). For example, a least mean squares (LMS) algorithm can be employed.

Figure 5:
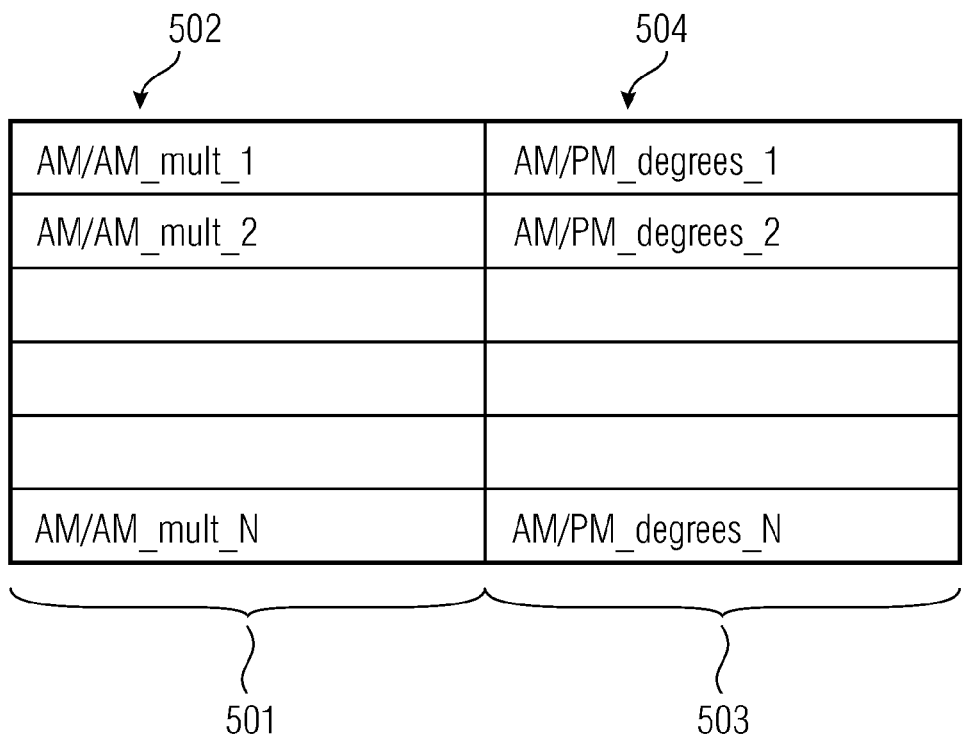
FIG. 5 shows an example table for storing AM/AM and AM/PM correction values to be used for adjusting a distortion compensation rule.

FIG. 5 shows an example table 500 for storing AM/AM and AM/PM correction values 502, 504 to be used for adjusting a distortion compensation rule. In the table 500 of FIG. 5, the first column 501 corresponds to the stored AM/AM correction values 502 denoted by "AM/AM_mult_1", "AM/AM_mult_2", . . . , "AM/AM_mult_N", while the second column 503 corresponds to the stored AM/PM correction values 504 denoted by "AM/PM_degrees_1", "AM/PM_degrees_2", . . . , "AM/PM_degrees_N". The table 500 shown in FIG. 5 can essentially be used by the predistorter 320 (AM/AM and AM/PM predistortion block) of the circuit 100 shown in FIG. 3.

The example table 500 of FIG. 5 can be considered as being very similar to the table 440 shown in FIG. 4D, where the content can be expanded for an AM/PM information. There are different ways to implement the tables exactly. If, for example, a fixed raster is used, one can store the AM/AM information as a multiplicative factor and the AM/PM information as an additive offset in degrees. In addition, it is also possible to use polynomials and store the polynomial's coefficient instead of the whole table.

For updating a predistortion coefficient by the predistorter 320 shown in FIG. 3, it is possible, for example, to use an LMS algorithm.

FIG. 6 shows a schematic diagram 600 of an example process of an envelope tracking which is characterized by an increasing envelope tracking depth. The example process of the envelope tracking shown in FIG. 6 may be performed with the bias modifier 110 of the circuit shown in FIG. 1B. For example, the bias modifier 110 is configured to provide a maximum DC/DC voltage (or maximum bias signal 115) and a minimum envelope tracking depth for an initial time slot 602 of a sequence of time slots 611. In addition, the bias modifier 110 may be configured to decrease the DC/DC voltage (or the bias signal 115) and to increase the envelope tracking depth for a later time slot 604, 606, 608 of the sequence of time slots 611 during the transmission of the amplified input signal 725.

In the schematic diagram 600 of FIG. 6, the decreasing DC/DC voltage 610 and the envelope 620 of the amplified input signal 725 obtained with the increasing envelope tracking depth are exemplarily depicted.

Referring to FIGS. 1A, 1B, 2 and 3, a transceiver 720 may comprise a power amplifier 150, a bias modifier 110, a feedback receiver 120 and an adjuster 130. The power amplifier 150 may be configured for providing an amplified input signal 725 based on an RF input signal 145 which is dependent on a digital baseband signal 715. The bias modifier 110 may be configured to vary a bias signal 115 for the power amplifier 150 based on the digital baseband signal 715. The feedback receiver 120 may be configured to determine an information describing the amplified input signal 725. The adjuster 130 may be configured to adjust a distortion compensation rule based on the information describing the amplified input signal 725, which is provided by the feedback receiver 120, to counteract or compensate a distortion of the amplified input signal 725.

The transceiver 720 may further comprise a DC/DC converter 240 configured to adjust a supply voltage 245 of the power amplifier 150 based on the bias signal 115.

For example, the bias modifier 110 of the transceiver 720 is configured to generate an instantaneous bias signal 115 for the DC/DC converter 240. In addition, the bias modifier 110 and the DC/DC converter 240 may be configured to keep the gain of the power amplifier 150 constant.

Furthermore, the transceiver 720 may further comprise a detector 260 which is coupled to the output of the power amplifier 150. The detector 260 may be configured to provide a measurement signal 265 for the feedback receiver 120.

Furthermore, the adjuster 130 of the circuit 100 may be configured to update the distortion compensation rule in real time during the transmission of the mobile communication device 700.

In summary of the previous examples, it has been found that it is possible to use a feedback receiver for learning and updating isogain contours or predistortion coefficients, according to which approach is being used. It is noted here that the DC/DC converter can be driven with a function of the modulation and of the isogain contours.

Referring again to FIG. 2, the baseband signal 715, x(t), can be sent to the TX block 140 and to the block 210 (mapper) that maps the amplitude of x(t) to an appropriate DCDC level, so that the power amplifier gain stays constant. It is pointed out here that if this mapping is accurate, the distortion due to the gain expansion (due to a DCDC increase) and the gain compression in the proximity of saturation will cancel each other, and the resulting wave will present a low intermodulation. Therefore, the adjacent channel leakage power ratio (ACLR) will be good. However, if the isogain curves' model is not appropriate, the ACLR will increase because the effective trajectory will deviate from ideality.

For example, a feedback path can be used in order to ensure a closed loop power control. However, it has been found that the feedback is also able to monitor the quality of the output wave (which is a feature such as used in "U_APB" and predistortion algorithms).

An advantage of the present system is that it can be used to adjust the isogain curves. For example, the transceiver can monitor the AM/AM characteristic of the transmitter and determine whether the gain is constant over the dynamic range of the signal. From this curve, an expansion or compression can be monitored and this information will then be used to adjust the isogain contour (or the predistortion coefficients).

It may also be possible to make a slow learning without storing any coefficients. The system may start in the first slots with a high DCDC voltage and a low envelope tracking depth, therefore with a limited efficiency gain, but with linearity surely within limits. During the slot, linearity is observed and the transceiver can measure whether the proximity to saturation dominates (gain loss at modulation peaks) or the other way around (gain expansion at modulation peaks) and adjust the isogain contours accordingly. Then, the envelope tracking depth can be increased and this process is iterated. This process has been sketched with reference to FIG. 6, where the thin line is the envelope 620 of the output signal and the thick one is the DCDC voltage 610.

The example process of FIG. 6 refers to Universal Mobile Telecommunications System (UMTS) and long-term evolution (LTE) which are slotted systems. For example, the update of the isogain contours (or the predistortion coefficients) can be performed once per slot (e.g. every 666 □s in UMTS, or 500 □s for LTE). It is, for example, possible to reserve a fixed time in each slot to measure the distortions introduced (measuring overall AM/AM and AM/PM curves) and apply the corrections in the next slot.

In general, it has been found that it is possible to use an RF feedback to evaluate properties of the output wave in order to update envelope tracking coefficients and algorithms to update these coefficients in real time during transmission.

More specifically, an improved transmit system is provided which features a power amplifier and/or a transmit chain whose working point can be controlled by the transmit system, a fast DC/DC converter which is able to follow whole or part of the AM content, means to generate an instantaneous DCDC voltage, so that the gain of the power amplifier stays constant, a feedback path which is able to evaluate the quality of the output wave, an algorithm that optimizes the coefficients/tables and an algorithm that starts with a low envelope tracking depth and increases it during transmission.

The improved transmit system may also comprise sensors for sensing, for example, a temperature, a voltage and/or a current for enhancing the capabilities of the bias control algorithm.

The invention claimed is:

1. A circuit for providing a bias signal for a power amplifier, the circuit comprising:
   a first input configured to receive an input signal comprising a digital baseband signal to be amplified by the power amplifier,
   a second input configured to receive the amplified input signal,
   an output configured to provide the bias signal;
   a bias modifier configured to vary the bias signal for the power amplifier based on the input signal, wherein the bias modifier comprises a mapper configured to map the amplitude of the digital baseband signal to a digital voltage signal based on a predetermined relationship and a digital-to-analog converter (DAC) configured to convert the mapped digital voltage signal into the bias signal for the power amplifier;
   a feedback receiver configured to determine an information describing the amplified input signal; and
   an adjuster configured to adjust a distortion compensation rule based on the information describing the amplified input signal, which is provided by the feedback receiver, to counteract or compensate a distortion of the amplified input signal.

2. The circuit according to claim 1, wherein the adjuster is configured to adjust the distortion compensation rule to counteract or compensate a distortion of the amplified input signal induced by the bias signal variation.

3. The circuit according to claim 1,
   wherein the bias modifier is configured to perform an envelope tracking (ET) modulation,
   wherein the feedback receiver and the adjuster are configured to perform an amplitude modulation (AM), and
   wherein the adjuster is configured to adjust the distortion compensation rule to counteract or compensate a distortion of the amplified input signal induced by a time misalignment between the amplitude modulation (AM) and the envelope tracking (ET) modulation.

4. The circuit according to claim 1, further comprising:
   a predistorter configured to perform a predistortion of the input signal to obtain a predistorted signal for the power amplifier,
   wherein the adjuster is configured to adjust a predistortion rule, and
   wherein the predistorter is configured to apply the predistortion rule to obtain the predistorted signal for the power amplifier.

5. The circuit according to claim 1, wherein the feedback receiver is configured to determine an amplitude information (A) and/or a phase information ($\phi$) as the information describing the amplified input signal.

6. The circuit according to claim 1, wherein the feedback receiver is configured to determine the information describing the amplified input signal using a measurement signal provided by a detector.

7. The circuit according to claim 1,
   wherein the adjuster comprises a calculator configured to calculate correction values from the information describing the amplified input signal,
   wherein the adjuster is configured to adjust the distortion compensation rule using the calculated correction values.

8. The circuit according to claim 7,
   wherein the feedback receiver is configured to determine an amplitude information (A) and/or a phase information ($\phi$) describing the amplified input signal, and
   wherein the calculator is configured to compare the amplitude information (A) and/or the phase information ($\phi$) describing the amplified input signal and the amplitude information and/or the phase information describing a desired input signal and calculate the correction values on the basis of the amplitude information and/or the phase information comparison.

* * * * *